(12) United States Patent
Kanazawa

(10) Patent No.: US 8,407,642 B2
(45) Date of Patent: Mar. 26, 2013

(54) LEAK CURRENT CALCULATION APPARATUS AND METHOD FOR CALCULATING LEAK CURRENT

(75) Inventor: Yuzi Kanazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 481 days.

(21) Appl. No.: 12/720,033

(22) Filed: Mar. 9, 2010

(65) Prior Publication Data

US 2010/0237878 A1 Sep. 23, 2010

(30) Foreign Application Priority Data

Mar. 17, 2009 (JP) ................................ 2009-065123

(51) Int. Cl.
*G06F 17/50* (2006.01)
*G06F 11/00* (2006.01)
*G01R 19/00* (2006.01)
*G01R 27/28* (2006.01)
*G01R 31/00* (2006.01)

(52) U.S. Cl. .......... 716/111; 716/106; 716/136; 703/16; 702/64; 702/117; 324/522; 714/32; 714/37; 714/738

(58) Field of Classification Search .................. 716/111, 716/106, 136; 703/16; 702/64, 117; 324/522; 714/32, 37, 738
See application file for complete search history.

(56) References Cited

U.S. PATENT DOCUMENTS

| 6,690,097 | B2 * | 2/2004 | Pierrot ............................. 307/42 |
| 7,137,080 | B2 | 11/2006 | Acar et al. |
| 7,256,621 | B2 * | 8/2007 | Lih et al. ........................ 326/121 |
| 8,086,887 | B2 * | 12/2011 | Akimoto ........................ 713/340 |
| 2006/0214695 | A1 * | 9/2006 | Lih et al. .......................... 326/98 |
| 2012/0146132 | A1 * | 6/2012 | Forbes .......................... 257/329 |

FOREIGN PATENT DOCUMENTS

JP 2005-71360 3/2005

* cited by examiner

*Primary Examiner* — Phallaka Kik
(74) *Attorney, Agent, or Firm* — Staas & Halsey LLP

(57) ABSTRACT

A leak current calculation apparatus includes an acquiring section for acquiring partial circuit information, and a grouping section for forming a plurality of groups each comprising a part of the partial circuits connected with each other and for generating group information. The apparatus includes a leak difference value calculating section for calculating a leak difference value, which is a difference between a provisional maximum value acquired by adding up the maximum values of the leak current values of all the partial circuits and a sum of maximum values of the leak current values contained in the group information of the groups, and a maximum leak current calculating section for calculating the maximum leak current value of the integrated circuit by adjusting the provisional maximum value with the leak difference value.

17 Claims, 14 Drawing Sheets

FIG.3A

PARTIAL CIRCUIT CHARACTERISTIC INFORMATION

| NAME | CELL TYPE | INPUT PATTERN | OUTPUT PATTERN | LEAK CURRENT VALUE |
|---|---|---|---|---|
| CELL 1 | NAND | 00 | 1 | 1 |
| | | 01 | 1 | 4 |
| | | 10 | 1 | 4 |
| | | 11 | 0 | 1 |
| CELL 2 | NAND | 00 | 1 | 1 |
| | | 01 | 1 | 4 |
| | | 10 | 1 | 4 |
| | | 11 | 0 | 1 |
| CELL 3 | NAND | 00 | 1 | 1 |
| | | 01 | 1 | 4 |
| | | 10 | 1 | 4 |
| | | 11 | 0 | 1 |
| CELL 4 | NOT | 0 | 1 | 8 |
| | | 1 | 0 | 6 |
| CELL 5 | NAND | 00 | 1 | 1 |
| | | 01 | 1 | 4 |
| | | 10 | 1 | 4 |
| | | 11 | 0 | 1 |
| ... | ... | ... | ... | ... |

FIG.3B

PARTIAL CIRCUIT
CONNECTION INFORMATION

| NAME | INPUT/ OUTPUT PIN NAME | INPUT/ OUTPUT TYPE | NETWORK NAME |
|---|---|---|---|
| CELL 1 | A1 | In | - |
|  | B1 | In | - |
|  | X1 | Out | net102 |
| CELL 2 | A2 | In | - |
|  | B2 | In | - |
|  | X2 | Out | net104 |
| CELL 3 | A3 | In | net102 |
|  | B3 | In | net104 |
|  | X3 | Out | net106 |
| CELL 4 | A4 | In | net106 |
|  | X4 | Out | net108 |
| CELL 5 | A5 | In | net108 |
|  | B5 | In | net114 |
|  | X5 | Out | - |
| ... | ... | ... | ... |

FIG.5A

PARTIAL CIRCUIT INFORMATION

| NAME | INCLUDED PARTIAL CIRCUITS | INPUT PATTERN | OUTPUT PATTERN | LEAK CURRENT VALUE |
|---|---|---|---|---|
| PARTIAL CIRCUIT GROUP 11 | CELL 1, AND CELL 3 | 000 | 1 | 5 |
| | | 100 | 1 | 8 |
| | | 010 | 1 | 8 |
| | | 001 | 0 | 2 |
| | | 110 | 1 | 2 |
| | | 101 | 0 | 5 |
| | | 011 | 0 | 5 |
| | | 111 | 1 | 5 |
| PARTIAL CIRCUIT GROUP 12 | CELL 1, CELL 2, CELL 3, AND CELL 4 | 0000 | 1 | 11 |
| | | 1000 | 1 | 14 |
| | | 0100 | 1 | 14 |
| | | 0010 | 1 | 14 |
| | | 0001 | 1 | 14 |
| | | 1100 | 0 | 12 |
| | | 1010 | ... | ... |
| | | 1001 | ... | ... |
| | | ... | ... | ... |
| | | ... | ... | ... |
| | | ... | ... | ... |
| | | ... | ... | ... |
| | | ... | ... | ... |
| | | ... | ... | ... |
| | | ... | ... | ... |
| ... | ... | ... | ... | ... |

FIG.5B

PARTIAL-CIRCUIT-GROUP
CONNECTION INFORMATION

| NAME | INPUT/ OUTPUT PIN NAME | INPUT/ OUTPUT TYPE | NETWORK NAME |
|---|---|---|---|
| PARTIAL CIRCUIT GROUP 11 | A1 | In | - |
| | B1 | In | - |
| | B3 | In | net104 |
| | X3 | Out | net106 |
| PARTIAL CIRCUIT GROUP 12 | A1 | In | - |
| | B1 | In | - |
| | A2 | In | - |
| | B2 | In | - |
| | X4 | Out | net108 |
| ... | ... | ... | ... |

| NAME | SELECTION REFERENCE VALUE |
|---|---|
| PARTIAL CIRCUIT GROUP 11 | 0 |
| PARTIAL CIRCUIT GROUP 12 | 1.5 |
| ... | ... |

35 PARTIAL CIRCUIT GROUP

PARTIAL
CIRCUIT
45 GROUP

FIG. 9

PARTIAL-CIRCUIT-GROUP
CHARACTERISTIC INFORMATION

| NAME | INCLUDED PARTIAL CIRCUIT | INPUT PATTERN | OUTPUT PATTERN | LEAK CURRENT VALUE |
|---|---|---|---|---|
| PARTIAL CIRCUIT GROUP 12 (SELECTED PARTIAL CIRCUIT GROUP) | CELL 1, CELL 2, CELL 3, AND CELL 4 | 0000 | 1 | 11 |
| | | 1000 | 1 | 14 |
| | | 0100 | 1 | 14 |
| | | 0010 | 1 | 14 |
| | | 0001 | 1 | 14 |
| | | 1010 | 0 | 12 |
| | | 1001 | ... | ... |
| | | ... | ... | ... |
| | | ... | ... | ... |
| | | ... | ... | ... |
| | | ... | ... | ... |
| | | ... | ... | ... |
| | | ... | ... | ... |
| | | ... | ... | ... |
| | | ... | ... | ... |
| | | ... | ... | ... |

NEW PARTIAL-CIRCUIT-GROUP
CHARACTERISTIC INFORMATION

| NAME | INCLUDED PARTIAL CIRCUIT | INPUT PATTERN | OUTPUT PATTERN | LEAK CURRENT VALUE |
|---|---|---|---|---|
| PARTIAL CIRCUIT GROUP 12 | CELL 1, CELL 2, CELL 3, AND CELL 4 | 1000 | 1 | 14 |
| | | 0100 | 1 | 14 |

 THE HIGHEST TWO LEAK CURRENT VALUES

FIG. 10A

| NAME | CELL TYPE | INPUT PATTERN | OUTPUT PATTERN | LEAK CURRENT VALUE |
|---|---|---|---|---|
| PARTIAL CIRCUIT GROUP 12 | — | 1000 | 1 | 14 |
|  |  | 0100 | 1 | 14 |
| CELL 5 | NAND | 00 | 1 | 1 |
|  |  | 01 | 1 | 4 |
|  |  | 10 | 1 | 4 |
|  |  | 11 | 0 | 1 |
| ... |  | ... | ... | ... |

} PARTIAL-CIRCUIT-GROUP CHARACTERISTIC INFORMATION ON SELECTED PARTIAL CIRCUIT GROUP WITH LIMITED INPUT PATTERNS

FIG. 10B

| NAME | INPUT/ OUTPUT PIN NAME | INPUT/ OUTPUT TYPE | NETWORK NAME |
|---|---|---|---|
| PARTIAL CIRCUIT GROUP 12 | A1 | In | — |
| | B1 | In | — |
| | A2 | In | — |
| | B2 | In | — |
| | X4 | Out | net108 |
| CELL 5 | A5 | In | net108 |
| | B5 | In | net114 |
| | X5 | Out | — |
| ... | ... | ... | ... |

⎫ PARTIAL-CIRCUIT-GROUP CONNECTION INFORMATION ON SELECTED PARTIAL CIRCUIT GROUP WITH LIMITED INPUT PATTERNS

LEAK CURRENT CALCULATION APPARATUS AND METHOD FOR CALCULATING LEAK CURRENT

CROSS-REFERENCE TO RELATED APPLICATIONS

This application is based upon and claims the benefit of priority of the prior Japanese Patent Application No. 2009-65123, filed on Mar. 17, 2009, the entire contents of which are incorporated herein by reference.

FIELD

The embodiments discussed herein are related to a leak current calculation apparatus and a method for calculating leak current, a storage medium for storing a leak current calculation program.

BACKGROUND

In recent years, with the higher integration of integrated circuits, the integrated circuits increasingly include finer cells. In general, finer cells increase the amount of leak current of integrated circuits. As the amount of leak current increases, power consumption and heat generation in an integrated circuit may increase, which may possibly damage the integrated circuit itself.

Accordingly, an amount of leak current, particularly the maximum leak current, of the integrated circuit is usually calculated while designing an integrated circuit. Specifically, a publicly known calculation method such as an SA (Simulated Annealing) method, a branch and bound method, a Monte Carlo method has been used to calculate the maximum leak current value of an integrated circuit. There is Japanese Laid-open Patent Publication No. 2005-71360 as a reference document.

However, the technology in the past has a problem of a longer calculation time for calculating the maximum amount of leak current of a highly-integrated circuit. For example, a technology using a Monte Carlo method determines the value of a signal to be input to a cell on the basis of a random number, calculates the value of the leak current corresponding to the input signal, and repeats this process. Therefore, the number of repetition of the process increases when the number of cells in an integrated circuit increases. This consumes a great amount of calculation time.

SUMMARY

According to an aspect of the embodiment, a leak current calculation apparatus for calculating a leak current value of an integrated circuit including a plurality of partial circuits, the leak current calculation apparatus includes an acquiring section for acquiring partial circuit information including leak current values caused by the partial circuits when input signal patterns are inputted to the partial circuits for each of the partial circuits, a grouping section for forming a plurality of circuit groups each comprising a part of the partial circuits connected with each other and for generating circuit group information including leak current values caused by the circuit groups when input signal patterns are inputted to the circuit groups for each of the circuit groups on the basis of the partial circuit information acquired by the acquiring section, a leak difference value calculating section for calculating a leak difference value, which is a difference between a provisional maximum value acquired by adding up the maximum values of the leak current values of all the partial circuits and a sum of maximum values of the leak current values contained in the circuit group information of the circuit groups, and a maximum leak current calculating section for calculating the maximum leak current value of the integrated circuit by adjusting the provisional maximum value with the leak difference value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A is a table for explaining examples of partial circuit information stored in a partial-circuit-information storage section.

FIG. 3B is a table for explaining examples of partial circuit information stored in the partial-circuit-information storage section.

FIG. 5A is a table for explaining examples of partial circuit group information stored in the partial-circuit-group-information storage section.

FIG. 5B is a table for explaining examples of partial circuit group information stored in the partial-circuit-group-information storage section.

FIG. 9 is a table for explaining processing by an input-signal-pattern limiting section.

FIG. 10A is a table for explaining processing by a partial-circuit-information updating section.

FIG. 10B is a table for explaining processing by the partial-circuit-information updating section.

DESCRIPTION OF EMBODIMENTS

Preferred embodiments of the present invention will be explained with reference to accompanying drawings. An embodiment of the leak current calculation program, leak current calculation apparatus and leak current calculation method disclosed herein will be described in detail with reference to drawings below.

Figure 1:
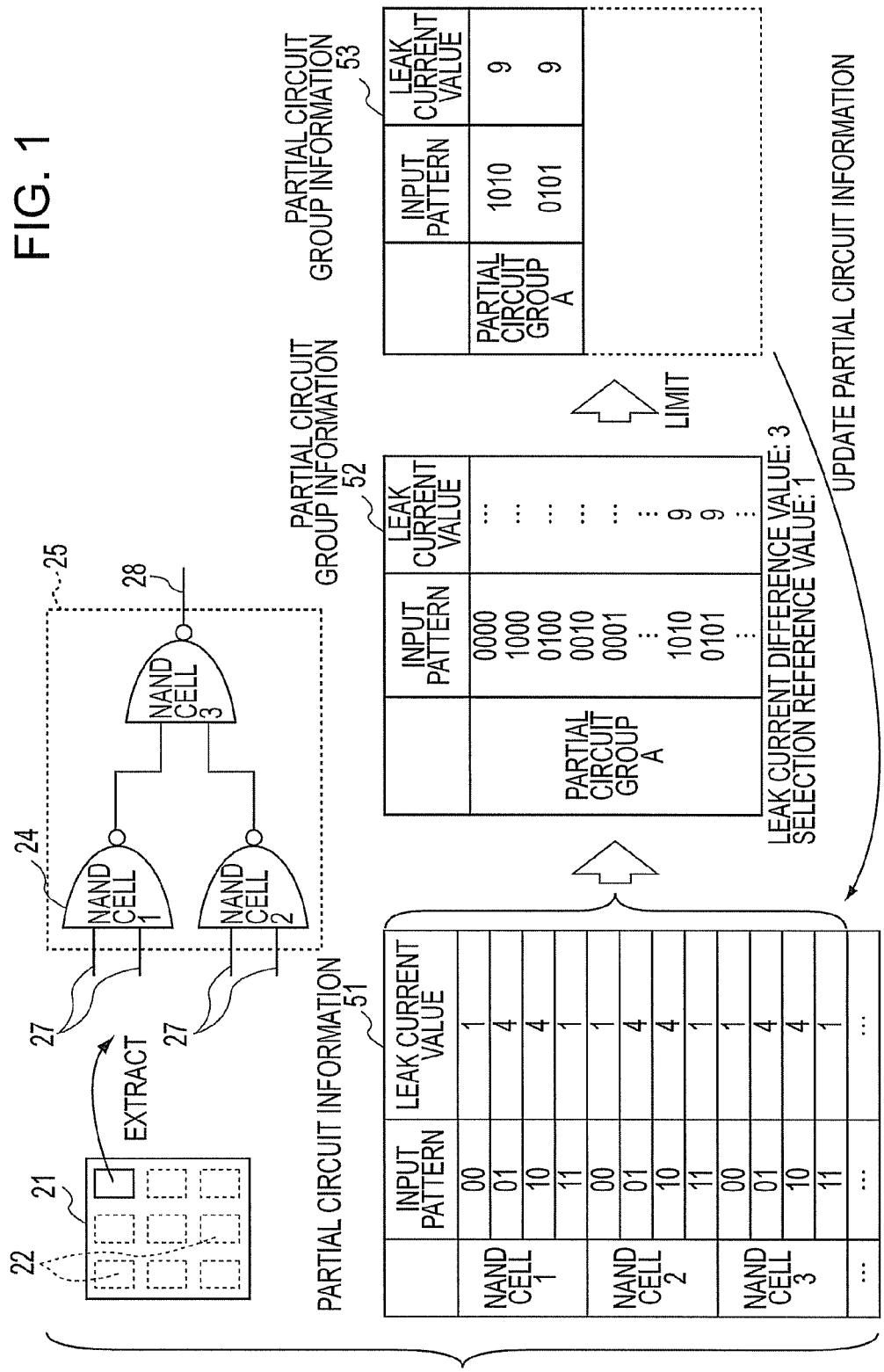
FIG. 1 is a diagram for schematically explaining a leak current calculation apparatus.

First of all, a leak current calculation apparatus according to an embodiment will be described. FIG. 1 is a diagram for schematically explaining a leak current calculation apparatus according to this embodiment.

As illustrated in FIG. 1, a leak current calculation apparatus according to this embodiment acquires partial circuit information having correspondence between a pattern of input signals and the leak current value caused by the pattern of input signals for each partial circuit included in an integrated circuit 21. On the basis of the partial circuit information on each partial circuit, the leak current calculation apparatus generates partial circuit group information having correspondence between the pattern of input signals and the leak current value caused by the pattern of the input signal for each partial circuit group 22. The term "partial circuit" refers to a circuit having one or more cells (or circuit elements) and may correspond to each of NAND cells 1 to 3 in a partial circuit group A 25 illustrated in FIG. 1, for example.

For example, as illustrated in FIG. 1, the leak current calculation apparatus acquires partial circuit information 51 on partial circuits 24 (including the NAND cells 1 to 3) included in the partial circuit group A 25. The leak current calculation apparatus then uses the partial circuit information 51 to combine the patterns of the input signals to the three NAND cells 1 to 3 included in the partial circuit group A 25. Thus, the leak current calculation apparatus calculates the leak current value caused by the patterns of the input signal to the partial circuit group A 25 having four input pins 27 and an output pin 28. In other words, because of the general function of NAND cells, when the input pattern of the NAND cell 1 is (10), the output pattern of the NAND cell 1 is (1). When the input pattern of the NAND cell 2 is (10), the output pattern of the NAND cell 2 is (1). Since the outputs of the NAND cell 1 and NAND cell 2 are input to the NAND cell 3, the input pattern of the NAND cell 3 is (11). On the basis of the fact, referring to the partial circuit information, the leak current value caused in the partial circuit group A 25 by the input pattern (1010) is "9", which is the sum of the leak current value "4" caused in the NAND cell 1 by the input pattern (10), the leak current value "4" caused in the NAND cell 2 by the input pattern (10), and the leak current value "1" caused in the NAND cell 3 by the input pattern (11). In this way, the leak current calculation apparatus generates partial circuit group information 52 on the partial circuit group A 25 having correspondence between the pattern of the input signals and the calculated leak current values.

Next, for each partial circuit group, the leak current calculation apparatus calculates a leak difference value that is a difference between a total of maximum values of leak current values of all partial circuits included in each partial circuit group and a maximum value of the leak current values included in the partial circuit group information on each of the partial circuit groups.

Here, a total of maximum values of the leak current values of all partial circuits included in a partial circuit group corresponds to the maximum value of the leak current value caused in the partial circuit group if the pattern of the input signal causing a maximum leak current value to partial circuits included in the partial circuit group is input. In other words, a total of maximum values of the leak current values of all partial circuits included in a partial circuit group corresponds to provisional maximum value of the leak current values of the partial circuit group (which will be called "provisional maximum value of the partial circuit group" hereinafter.) However, in reality, the pattern of input signals causing a maximum leak current value to partial circuits included in a partial circuit group may not be input. In this case, the maximum value of the leak current values of the partial circuit group is lower than the provisional maximum value of the partial circuit group. According to this embodiment, a leak difference value is calculated for each partial circuit group so as to evaluate the amount of decrease of the maximum value of the leak current values of the partial circuit group calculated in consideration of the real input signal pattern from the provisional maximum value of the partial circuit group.

For example, referring to the partial circuit information, the maximum value of the leak current values in the NAND cells 1 to 3 included in the partial circuit group A 25 illustrated in FIG. 1 is "4". Thus, a total of maximum values of the leak current values of all three NAND cells included in the partial circuit group A, that is, the provisional maximum value of the partial circuit group A 25 is "4"×"3"="12". On the other hand, referring to the partial circuit group information generated in consideration of the real input signal pattern, the maximum value of the leak current values of the partial circuit group A is "9" if the pattern of the input signal to the four input pins 27 is (1010). Thus, the leak difference value is "12"−"9"="3". In other words, in consideration of the real input signal pattern, the maximum value of the leak current values of the partial circuit group A is lower than the provisional maximum value of the partial circuit group A 25 by "3".

On the basis of the leak difference value, the leak current calculation apparatus next selects, from plural partial circuit groups, one partial circuit group having a higher efficiency of decrease of the maximum value of the leak current values of the partial circuit group calculated in consideration of the real input signal pattern from the provisional maximum value of the leak current values of the partial circuit group. For example, for the partial circuit group A illustrated in FIG. 1, the leak current calculation apparatus calculates a selection reference value "1" which is a value acquired by dividing the leak difference value "3", by "3", which is the number of the partial circuits (or NAND cells) included in the partial circuit group A.

Here, the selection reference value is a reference value for evaluating the efficiency of decrease of the maximum value of the leak current values of the partial circuit group calculated in consideration of the real input signal pattern from a provisional maximum value of the partial circuit group. As the value increases, the efficiency of decrease increases. The selection reference value is a value acquired by dividing the leak difference value by the number of partial circuits included in a partial circuit group and is a value indicating how much the provisional maximum value of the partial circuit group may be reduced for each one partial circuit included in a partial circuit group.

The leak current calculation apparatus then stores the selection reference value in association with the corresponding partial circuit group. The leak current calculation apparatus then selects one partial circuit group having the highest selection reference value from the plural partial circuit groups.

The leak current calculation apparatus next limits the pattern of the input signals to the selected partial circuit group, which is the selected one partial circuit group, to the pattern of the input signal corresponding to a highest leak current value of the selected partial circuit group.

For example, when the partial circuit group A illustrated in FIG. 1 is the selected partial circuit group, the leak current calculation apparatus limits the pattern of input signal contained in the partial circuit group information on the partial circuit group A to the patterns (1010) and (0101) of the input signals, which correspond to the maximum leak current value 9 and second leak current value 9.

The leak current calculation apparatus then adds the partial circuit group information on the selected partial circuit group with the limited pattern of input signals to the partial circuit information on each of the corresponding partial circuits and deletes the partial circuit information on the partial circuit included in the selected partial circuit group from the partial circuit information on each of the corresponding partial circuits to update the partial circuit information.

For example, as illustrated in FIG. 1, the leak current calculation apparatus adds the partial circuit group information 53 on the partial circuit group A with a limited pattern of input signals to the partial circuit information on each of the partial circuits and deletes the partial circuit information on the partial circuits or (NAND cells 1 to 3) included in the partial circuit group A from the partial circuit information 51 on each of the partial circuits to update the partial circuit information 51.

The leak current calculation apparatus repeats the processing until the number of times of update on the partial circuit information reaches a predetermined number of times. While repeating the processing, the leak current calculation apparatus limits the patterns of the input signals included in the partial circuit group information on the selected partial circuit group. The leak current calculation apparatus then adds the partial circuit group information on the selected partial circuit group with the limited patterns of input signals to the partial circuit information on each of the corresponding partial circuits and deletes the partial circuit information on the partial circuits included in the selected partial circuit group from the partial circuit information on each of the corresponding partial circuits to update the partial circuit information. On the basis of the updated partial circuit information, the leak current calculation apparatus regenerates partial circuit group information for each partial circuit group. As described above, the updated partial circuit information contains the partial circuit group information on the selected partial circuit group with the limited pattern of input signals. Thus, the leak current calculation apparatus may reduce the amount of the calculation processing for generating the partial circuit group information.

When the number of times of update on the partial circuit information reaches the predetermined number of times, the leak current calculation apparatus extracts the maximum values of the leak current values of the partial circuits from the partial circuit information and calculates a total of the extracted maximum values of the leak current values as a maximum leak current value of the integrated circuit.

In this way, the leak current calculation apparatus according to this embodiment may calculate a maximum leak current value of an integrated circuit fast. In other words, by limiting the patterns of input signals contained in the partial circuit group information and repeating the processing of updating the partial circuit information, the leak current calculation apparatus calculates a maximum leak current value of an integrated circuit. Thus, the entire calculation time may be reduced.

Figure 2:
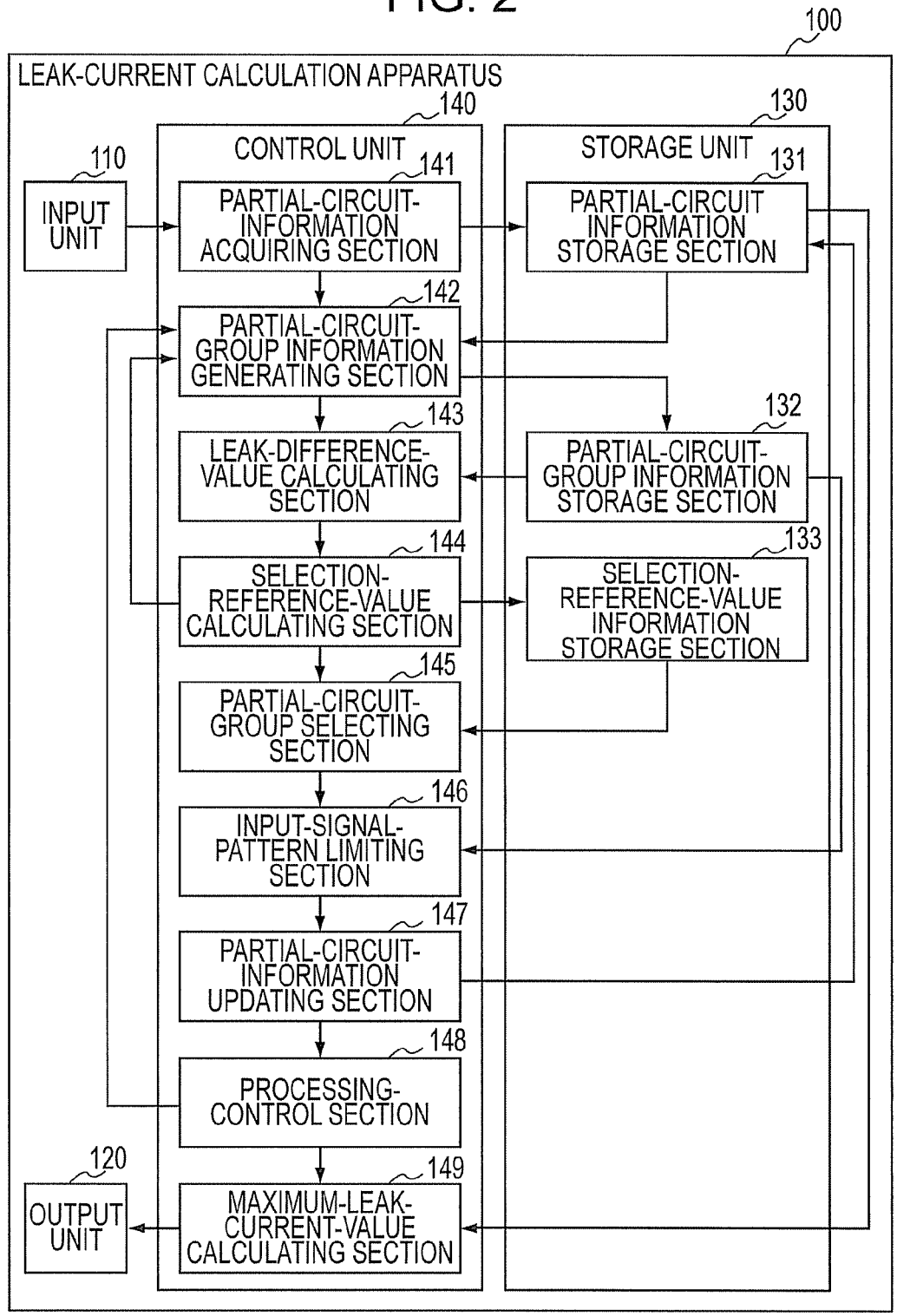
FIG. 2 is a block diagram for explaining a configuration of the leak current calculation apparatus.

Next, with reference to FIG. 2, there will be described a configuration of the leak current calculation apparatus 100 according to the first embodiment illustrated in FIG. 1. FIG. 2 is a block diagram for explaining a configuration of the leak current calculation apparatus 100 according to this embodiment. As illustrated in FIG. 2, the leak current calculation apparatus 100 has an input unit 110, an output unit 120, a storage unit 130, and a control unit 140.

The input unit 110 receives information from a user employing the leak current calculation apparatus 100. The input unit 110 transmits the received information to the control unit 140. The output unit 120 outputs the information transmitted by the control unit 140 to a user. For example, the output unit 120 outputs information on a maximum leak current value of an integrated circuit to a user.

The storage unit 130 stores data to be used by processing by the control unit 140. The storage unit 130 particularly has a partial-circuit-information storage section 131, a partial-circuit-group-information storage section 132, and a selection-reference-value-information storage section 133.

The partial-circuit-information storage section 131 stores partial circuit information, which is information on a partial circuit included in an integrated circuit, as illustrated in FIG. 3A and FIG. 3B. The partial circuit information stored in the partial-circuit-information storage section 131 is read and written by a partial-circuit-information acquiring section 141. The partial circuit information stored in the partial-circuit-information storage section 131 is updated by a partial-circuit-information updating section 147.

FIG. 3A and FIG. 3B are diagrams for explaining examples of the partial circuit information stored in the partial-circuit-information storage section 131. As illustrated in FIG. 3A and FIG. 3B, the partial-circuit-information storage section 131 stores the partial circuit characteristic information and partial circuit connection information as the partial circuit information.

The partial circuit characteristic information is information describing a characteristic on all partial circuits included in an integrated circuit and is information having correspondence among, as illustrated in FIG. 3A, information on a name, a cell type, an input pattern, an output pattern and leak current. The name is a name of a partial circuit included in an integrated circuit. The cell type indicates the type (such as AND, OR and NAND) of the cell if the partial circuit has one cell or is blank if the partial circuit has two or more cells. The input pattern is a pattern of input signals to be input to the partial circuit. The output pattern is a pattern of output signals to be output from the partial circuit. The leak current is a leak current value caused by the partial circuit.

The partial circuit connection information is information describing the connection relationship among all partial circuits included in the integrated circuit, and is information having correspondence among information on a name, an input/output pin name, the type of input/output and a network name as illustrated in FIG. 3B. The name is a name of a partial circuit included in an integrated circuit. The input/output pin name is names of input and output pins provided in the partial circuit. The type of input/output is a type of a pin provided in the partial circuit. The type "In" indicates an input pin, and the type "Out" indicates an output pin. The network name is a name of a network connecting to a pin provided in the partial circuit.

Figure 4:
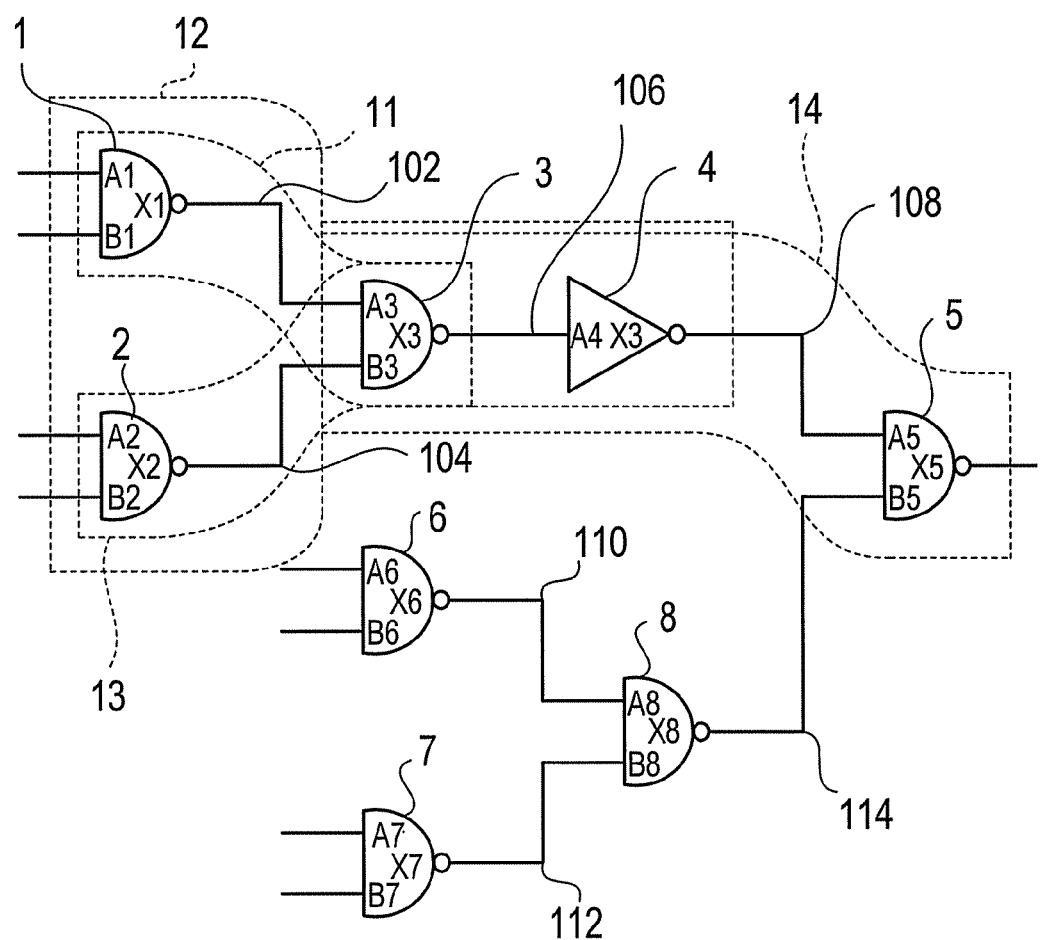
FIG. 4 is a diagram for explaining an example of the integrated circuit described by the partial circuit connection information.

Here, the partial circuit connection information illustrated in FIG. 3B is information on a partial circuits included in the integrated circuit in FIG. 4. FIG. 4 is a diagram for explaining an example of the integrated circuit described by the partial circuit connection information. For example, focusing on a cell 3, as illustrated in FIG. 3B and FIG. 4, an input pin A3 of the cell 3 is connected to an output pin X1 of a cell 1 over a network 102. An input pin B3 of the cell 3 is connected to an output pin X2 of a cell 2 over a network 104. An output pin X3 of the cell 3 is connected to an input pin A4 of a cell 4 over a network 106.

The partial circuit characteristic information illustrated in FIG. 3A is information on a partial circuit included in the integrated circuit illustrated in FIG. 4. For example, focusing on the cell 3, as illustrated in FIG. 3A and FIG. 4, when an input signal of an input pattern (01) is input to the input pin A3 and the input pin B3, the output pin X3 outputs an output signal of an output pattern (1). When an input signal of the input pattern (01) is input to the input pin A3 and input pin B3, the leak current value caused in the cell 3 is "4".

The partial-circuit-group-information storage section 132 stores the partial circuit group information, which is information on the partial circuit group including mutually connected partial circuits, as illustrated in FIG. 5A and FIG. 5B. The partial circuit group information stored in the partial-circuit-group-information storage section 132 is generated and stored by a partial-circuit-group-information generating section 142.

FIG. 5A and FIG. 5B are diagrams for explaining examples of the partial circuit group information stored in the partial-circuit-group-information storage section 132. As illustrated in FIG. 5A and FIG. 5B, the partial-circuit-group-information storage section 132 stores, as the partial circuit group information, partial circuit group characteristic information and partial circuit group connection information.

The partial circuit group characteristic information is information describing a characteristic of a partial circuit group and is information having correspondence among information on a name, included partial circuits, an input pattern, an output pattern, and a leak current, as illustrated in FIG. 5A. The name is a name of a partial circuit group. The included partial circuits are partial circuits included in the partial circuit group. The input pattern is a pattern of input signals to be input to the partial circuit group. The output pattern is a pattern of output signals output from the partial circuit group. The leak current is a leak current value caused in the partial circuit group.

The partial circuit group connection information is information describing a connection relationship between partial circuit groups, and is information having correspondence among information on a name, an input/output pin name, an input/output type, and a network name, as illustrated in FIG. 5B. The name is a name of a partial circuit group. The input/output pin name is a name of an input pin or an output pin provided in the partial circuit group. The input/output type is the type of a pin provided in the partial circuit group. The type "In" indicates an input pin, and the type "Out" indicates an output pin. The network name is the name of a network connecting to a pin provided in the partial circuit group.

The partial circuit group connection information illustrated in FIG. 5B is information on a partial circuit group included in the integrated circuit illustrated in FIG. 4. For example, as illustrated in FIG. 4 and FIG. 5B, focusing on the partial circuit group 11 including the cell 1 and cell 3 connected over the network 102, the input pin A1 and input pin B1 of the partial circuit group 11 are not connected to other partial circuits. The input pin B3 of the partial circuit group 11 is connected to the output pin X2 of the cell 2 over the network 104. The output pin X3 of the partial circuit group 11 is connected to the input pin A4 of the cell 4 over the network 106.

The partial circuit group characteristic information illustrated in FIG. 5B is information on a partial circuit group included in the integrated circuit illustrated in FIG. 4. For example, as illustrated in FIG. 4 and FIG. 5B, focusing on the partial circuit group 11 including the cell 1 and cell 3 mutually connected over the network 102, when an input signal of the input pattern (010) is input to the input pin A1, input pin B1 and input pin B3, the output pin X3 outputs an output signal of the output pattern (1). When an input signal of the input pattern (010) is input to the input pin A1, input pin B1 and input pin B3, the leak current value caused in the partial circuit group 11 is "8".

The selection-reference-value-information storage section 133 stores selection reference value information, which is information having correspondence between a selection reference value and a partial circuit group. The selection reference value information stored in the selection-reference-value-information storage section 133 is calculated and stored by a selection-reference-value calculating section 144, which will be described later. The selection reference value information stored in the selection-reference-value-information storage section 133 is referred by a partial-circuit-group selecting section 145, which will be described later, when the partial-circuit-group selecting section 145 selects one partial circuit group from plural partial circuit group.

Figures 6, 7:
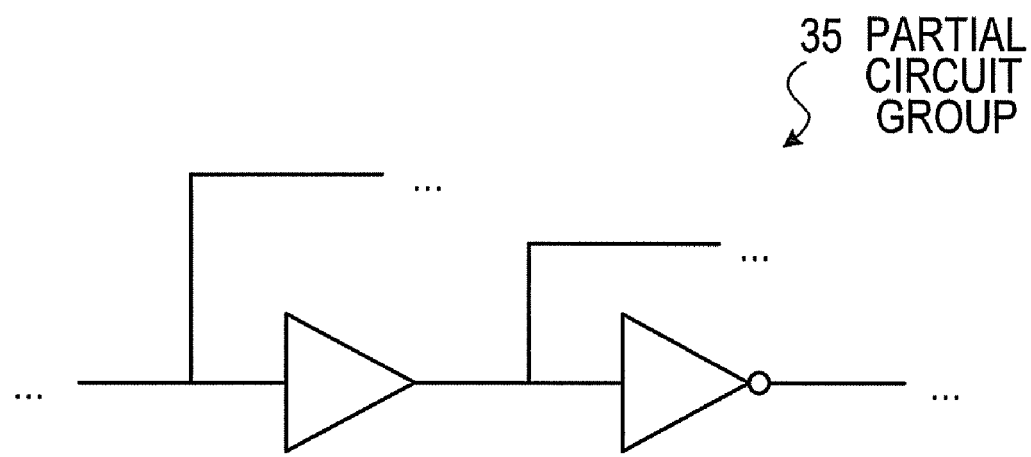
FIG. 6 is a table for explaining examples of selection reference value information stored in a selection-reference-value-information storage section.
FIG. 7 is a diagram for explaining processing by a partial-circuit-group-information generating section.

FIG. 6 is a diagram for explaining examples of the selection reference value information stored in the selection-reference-value-information storage section 133. As illustrated in FIG. 6, the selection reference value information is information that records the selection reference value of a partial circuit group for each partial circuit group. The selection reference value is, as described above, a value to be referred for evaluation of the efficiency of decrease of the maximum value of the leak current values of the partial circuit group calculated in consideration of the real input signal pattern from the provisional maximum value of the partial circuit group. In the examples illustrated in FIG. 6, the selection reference value of the partial circuit group 11 is "0", and the selection reference value of the partial circuit group 12 is "1.5". Thus, the partial circuit group 12 has a higher efficiency of decrease than the partial circuit group 11.

The control unit 140 is a processing unit having an internal memory that stores a program and control data defining a leak current calculation processing routine and performing various leak current calculation processing in the leak current calculation apparatus 100. The control unit 140 has the partial-circuit-information acquiring section 141, the partial-circuit-group-information generating section 142, a leak-difference-value calculating section 143, the selection-reference-value calculating section 144, the partial-circuit-group selecting section 145, an input-signal-pattern limiting section 146, the partial-circuit-information updating section 147, a processing control unit 148, and a maximum-leak-current-value calculating section 149.

The partial-circuit-information acquiring section 141 acquires partial circuit information. More specifically, the partial-circuit-information acquiring section 141 receives partial circuit information from the input unit 110 and stores the received partial circuit information to the partial-circuit-information storage section 131.

On the basis of the partial circuit information on each of the corresponding partial circuits stored in the partial-circuit-information storage section 131, the partial-circuit-group-information generating section 142 forms a plurality of circuit groups each comprising a part of the partial circuits connected with each other and generates partial circuit group information for each of the partial circuit group.

More specifically, the partial-circuit-group-information generating section 142 first refers to the partial circuit connection information (refer to FIG. 3B) stored in the partial-circuit-information storage section 131, extracts one arbitrary partial circuit, and identifies other partial circuits connected to the extracted partial circuit. In other words, the partial-circuit-group-information generating section 142 regards the arbitrary partial circuit and other partial circuits as a partial circuit group. The partial-circuit-group-information generating section 142 then refers to the partial circuit characteristic information (refer to illustrated in FIG. 3A) stored in the partial-circuit-information storage section 131 and properly combines the input patterns for the partial circuits included in the partial circuit group. Thus, the partial-circuit-group-information generating section 142 calculates the leak current value caused in accordance with the input pattern for the partial circuit group.

For example, as illustrated in the example in FIG. 4, the partial-circuit-group-information generating section 142 refers to the partial circuit connection information (refer to FIG. 3B) and extracts the cell 1 as the arbitrary partial circuit. The partial-circuit-group-information generating section 142 then refers to the partial circuit connection information and identifies the input pin A3 of the cell 3 connected over the network 102 to the output pin X1 of the cell 1. The partial-circuit-group-information generating section 142 regards a set of the cell 1 and cell 3 mutually connected over the network 102 as the partial circuit group 11. The partial-circuit-group-information generating section 142 then refers to the partial circuit characteristic information (refer to FIG. 3A) and properly combines the input patterns for the cell 1 and cell 3 included in the partial circuit group 11. Thus, the partial-circuit-group-information generating section 142 calculates the leak current value caused in accordance with the input pattern for the partial circuit group 11. In other words, when the input pattern for the cell 1 is (00), the output pattern of the cell 1 is (1), and the leak current value of the cell 1 is "1". The output pin X1 of the cell 1 and the input pin A3 of the cell 3 are connected over the network 102. Thus, the output pattern (1) of the cell 1 corresponds to the input signal "1" to the input pin A3 of the cell 3. As a result, the input pattern of the cell 3 is (10) or (11). When the input pattern of the cell 3 is (10), the leak current value of the cell 3 is "4". In other words, when the input pattern to the partial circuit group 11 is (000), the leak current value of the partial circuit group 11 including the cell 1 and cell 3 is "5", which may be acquired by calculating the sum of the leak current value "1" of the cell 1 and the leak current value "4" of the cell 3.

The number of arbitrary partial circuits to be extracted by the partial-circuit-group-information generating section 142 is equal to the number of partial circuits included in the integrated circuit, that is, the number of partial circuits described in the partial circuit connection information. The partial-circuit-group-information generating section 142 calculates the leak current value of the partial circuit group including the extracted arbitrary partial circuit.

The partial-circuit-group-information generating section 142 then generates partial circuit group information for each partial circuit group. In other words, the partial-circuit-group-information generating section 142 associates each partial circuit group and information on the included partial circuits, input pattern, output pattern, and the calculated leak current value so as to generate partial circuit group characteristic information (refer to FIG. 5A), which is one piece of the partial circuit group information. The partial-circuit-group-information generating section 142 associates each partial circuit group and information on an input/output pin name, an input/output type, and a network name so as to generate partial circuit group connection information (refer to FIG. 5B), which is one piece of the partial circuit group information.

Figure 8:
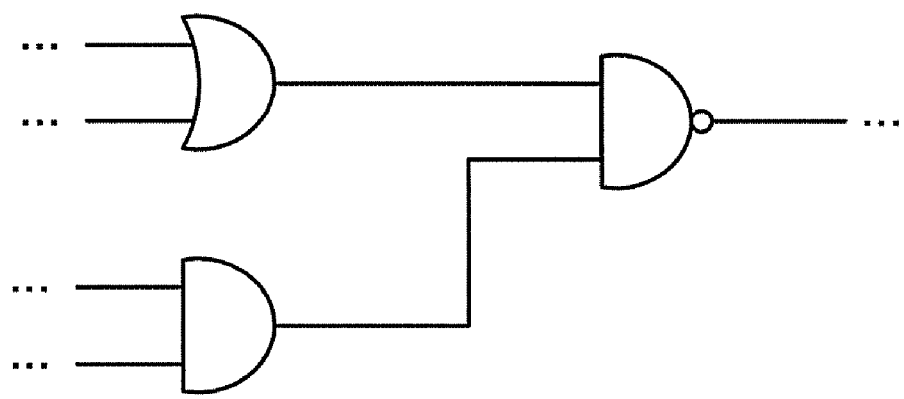
FIG. 8 is a diagram for explaining processing by the partial-circuit-group-information generating section.

The partial-circuit-group-information generating section 142 may generate the partial circuit group information on the partial circuit group 35 including partial circuits connected mutually in a tree shape of single-input/multi-output as illustrated in FIG. 7 before the partial circuit group information on the other partial circuit group. The partial-circuit-group-information generating section 142 may generate the partial circuit group information on the partial circuit group 45 including the partial circuits mutually connected in a tree shape of multi-input/single-output as illustrated in FIG. 8 before the partial circuit group information on the other partial circuit group. The partial circuit group illustrated in FIG. 7 or FIG. 8 has a relatively simple circuit structure. Thus, when the partial-circuit-group-information generating section 142 generates the partial circuit group information on the partial circuit groups by priority, the speed of the processing may be increased. FIG. 7 and FIG. 8 are diagrams for explaining processing by the partial-circuit-group-information generating section 142.

The partial-circuit-group-information generating section 142 stores the generated partial circuit group information to the partial-circuit-group-information storage section 132. The partial-circuit-group-information generating section 142 transmits the partial circuit information (partial circuit characteristic information and partial circuit connection information) read from the partial-circuit-information storage section 131 to the leak-difference-value calculating section 143.

The leak-difference-value calculating section 143 calculates, for each partial circuit group, the leak difference value, which is a difference between a provisional maximum value acquired by adding the maximum values of the leak current values of all partial circuits included in each partial circuit group and the maximum value of the leak current value included in the partial circuit group information for each partial circuit group, which is generated by the partial-circuit-group-information generating section 142.

More specifically, the leak-difference-value calculating section 143 first uses the information on the included partial circuits, which is contained in the partial circuit group characteristic information (refer to FIG. 5A) stored in the partial-circuit-group-information storage section 132 to identify the partial circuit characteristic information (refer to FIG. 3A) on all partial circuits included in the partial circuit group. The leak-difference-value calculating section 143 detects the maximum values of the leak current values of all partial circuits included in the partial circuit group from the identified partial circuit characteristic information and adds all of the detected maximum values to calculate the provisional maximum value. The leak-difference-value calculating section 143 calculates the difference between the calculated provisional maximum value and the maximum value of the leak current values, which is contained in the partial circuit group characteristic information for each of the partial circuit groups stored in the partial-circuit-group-information storage section 132 to calculate the leak difference value for each partial circuit group.

For example, processing will be described in which the leak-difference-value calculating section 143 calculates the leak difference value of the partial circuit group 11 illustrated in FIG. 4. The leak-difference-value calculating section 143 uses the information on the included partial circuits of the partial circuit group 11, which is contained in the partial circuit group characteristic information (refer to FIG. 5A) to identify the partial circuit characteristic information (refer to FIG. 3A) on the cell 1 and cell 3 included in the partial circuit group 11. The leak-difference-value calculating section 143 then detects the maximum leak current value "4" of the cell 1 and the maximum leak current value "4" of the cell 3 from the partial circuit characteristic information on the identified cell 1 and cell 3 and adds all of the maximum values to calculate the provisional maximum value "8". The leak-difference-value calculating section 143 calculates the difference between the calculated provisional maximum value "8" and the maximum value "8" of the leak current values, which is contained in the partial circuit group characteristic information on the partial circuit group 11 stored in the partial-circuit-group-information storage section 132 to calculate the leak difference value "0".

The leak-difference-value calculating section 143 transmits the calculated leak difference value to the selection-reference-value calculating section 144. The leak-difference-value calculating section 143 transmits the partial circuit information (partial circuit characteristic information and partial circuit connection information) received from the partial-circuit-group-information generating section 142 to the selection-reference-value calculating section 144.

The selection-reference-value calculating section 144 calculates, for each partial circuit group, the selection reference value, which is acquired by dividing the leak difference value by the number of partial circuits included in the partial circuit group. More specifically, the selection-reference-value calculating section 144 first uses the information on the included partial circuits in the partial circuit group characteristic information (refer to FIG. 5A) to count the number of partial circuits included in the partial circuit group and divides the leak difference value by the counted number of partial circuits to calculate the selection reference value for each partial circuit group. In this way, the selection-reference-value calculating section 144 calculates the selection reference value for each partial circuit group so as to calculate the reference value for comparing the efficiencies of decrease of the provisional maximum values of the partial circuit groups between partial circuit groups.

The selection-reference-value calculating section 144 stores the selection reference value information having correspondence between a partial circuit group and the calculated selection reference value to the selection-reference-value-information storage section 133.

The selection-reference-value calculating section 144 determines whether any unextracted partial circuit, which is a partial circuit not yet extracted by the partial-circuit-group-information generating section 142, exists in the partial circuits included in the integrated circuit or not. More specifically, the selection-reference-value calculating section 144 refers to the information on the partial circuits included in the partial circuit connection information to determine whether any unextracted partial circuit exists or not.

If it is determined that some unextracted partial circuit exists, the selection-reference-value calculating section 144 notifies the fact to the partial-circuit-group-information generating section 142. The partial-circuit-group-information generating section 142 having received the notification extracts a partial circuit excluding the extracted partial circuits, re-calculates the leak current value of the partial circuit group including the extracted partial circuits, and newly generates the partial circuit group characteristic information and partial circuit group connection information. On the other hand, if it is determined that no unextracted partial circuits exist, the selection-reference-value calculating section 144 notifies the fact to the partial-circuit-group selecting section 145.

On the basis of the leak difference value calculated by the leak-difference-value calculating section 143, the partial-circuit-group selecting section 145 selects one partial circuit group from plural partial circuit groups. More specifically, the partial-circuit-group selecting section 145 selects one partial circuit group with the highest selection reference value, which is stored in the selection-reference-value-information storage section 133, from the plural partial circuit groups. Here, the partial-circuit-group selecting section 145 selects a partial circuit group with the highest selection reference value in order to select a partial circuit group with the highest efficiency of decrease of the provisional maximum value of the partial circuit group.

The partial-circuit-group selecting section 145 notifies the information on the selected partial circuit group, which is the selected one partial circuit group, to the input-signal-pattern limiting section 146.

The input-signal-pattern limiting section 146 limits the input patterns contained in the partial circuit group information on the selected partial circuit group to the input pattern corresponding to a highest leak current value. More specifically, the input-signal-pattern limiting section 146 extracts the partial circuit group characteristic information on the selected partial circuit group from the partial circuit group information (FIG. 5A) for partial circuit groups stored in the partial-circuit-group-information storage section 132. The input-signal-pattern limiting section 146 then newly generates partial circuit group characteristic information in which the input patterns contained in the extracted partial circuit group characteristic information is limited to the input patterns corresponding to the upper leak current value N. FIG. 9 is a diagram for explaining processing by the input-signal-pattern limiting section 146.

For example, between or among the plural partial circuit groups (such as the partial circuit group 11 and the partial circuit group 12) illustrated in FIG. 4, when the partial circuit group 12 is the selected partial circuit group, the input-signal-pattern limiting section 146 extracts the partial circuit group characteristic information (refer to FIG. 5A) on the partial circuit group 12 from the partial-circuit-group-information storage section 132, as illustrated in FIG. 9. The input-signal-pattern limiting section 146 then detects the maximum leak current value "14" and second leak current value "14" from the partial circuit group characteristic information on the partial circuit group 12 as the higher two leak current values of the partial circuit group 12. The input-signal-pattern limiting section 146 then newly generates partial circuit group characteristic information in which the patterns of input signals to the partial circuit group 12 are limited to two input signal patterns (1000) and (0100) corresponding to the detected higher two leak current values.

The input-signal-pattern limiting section 146 transmits the partial circuit group characteristic information on the selected partial circuit group with the limited input patterns and the corresponding partial circuit group connection information to the partial-circuit-information updating section 147.

The partial-circuit-information updating section 147 adds the partial circuit group information on the selected partial circuit group with the limited input patterns to the partial circuit information on each of the partial circuits and deletes the partial circuit information on the partial circuits included in the selected partial circuit group from the partial circuit information on each of the corresponding partial circuits so as to update the partial circuit information stored in the partial-circuit-information storage section 131.

More specifically, as illustrated in FIG. 10A, the partial-circuit-information updating section 147 adds the partial circuit group characteristic information (refer to FIG. 9) on the selected partial circuit group with the limited input patterns to the partial circuit characteristic information (refer to FIG. 3A) on each of the partial circuits, which is stored in the partial-circuit-information storage section 131. Correspondingly, the partial-circuit-information updating section 147 deletes the partial circuit characteristic information on the partial circuits (which are the cell 1, cell 2, cell 3 and cell 4 included in the partial circuit group 12 in the example in FIG. 9) included in the selected partial circuit group from the partial circuit characteristic information on each of the partial circuits, which is stored in the partial-circuit-information storage section 131. Thus, the partial-circuit-information updating section 147 updates the partial circuit characteristic information stored in the partial-circuit-information storage section 131. FIG. 10A is a diagram for explaining the processing by the partial-circuit-information updating section 147.

As illustrated in FIG. 10B, the partial-circuit-information updating section 147 adds the partial circuit group connection information (refer to FIG. 5B) on the selected partial circuit group with the limited input patterns to the partial circuit characteristic information (refer to FIG. 3B) on each of the partial circuits, which is stored in the partial-circuit-information storage section 131. Correspondingly, the partial-circuit-information updating section 147 deletes the partial circuit connection information on the partial circuits included in the selected partial circuit group from the partial circuit connection information on each of the partial circuit, which is stored in the partial-circuit-information storage section 131. Thus, the partial-circuit-information updating section 147 updates the partial circuit connection information stored in the partial-circuit-information storage section 131. FIG. 10B is a diagram for explaining the processing by the partial-circuit-information updating section 147.

The partial-circuit-information updating section 147 counts the number of times of update on the partial circuit information stored in the partial-circuit-information storage section 131 and notifies the counted number of times of update to the processing control unit 148.

The processing control unit 148 causes the processing sections to repetitively perform the corresponding processing until the number of times of processing by the partial-circuit-information updating section 147 reaches a predetermined number of times. More specifically, the processing control unit 148 first determines whether the number of times of update notified from the partial-circuit-information updating section 147 has reached a predetermined number of times or not. If not, the processing control unit 148 again causes the partial-circuit-group-information generating section 142 to generate the partial circuit group information on each of the partial circuit group on the basis of the partial circuit information on each of the corresponding partial circuits, which is stored in the partial-circuit-information storage section 131. In this case, the partial circuit information on each of the corresponding partial circuits stored in the partial-circuit-information storage section 131 is updated by the partial-circuit-information updating section 147. In other words, the partial circuit information on each of the corresponding partial circuits, which is stored in the partial-circuit-information storage section 131, contains the partial circuit group information on the selected partial circuit group with the limited pattern of input signals. Thus, the amount of calculation processing for generating the partial circuit group information on each of the partial circuit groups by the partial-circuit-group-information generating section 142 decreases. Upon completion of the creation of the partial circuit group information on each of the partial circuit groups by the partial-circuit-group-information generating section 142, the processing control unit 148 again causes the leak-difference-value calculating section 143, selection-reference-value calculating section 144, partial-circuit-group selecting section 145, input signal pattern limiting section 146 and partial-circuit-information updating section 147 to perform the corresponding processing.

On the other hand, if it is determined that the number of times of update notified from the partial-circuit-information updating section 147 has reached the predetermined number of times, the processing control unit 148 notifies the fact to the maximum-leak-current-value calculating section 149.

In this way, the leak current calculation apparatus 100 repeats the series of processing steps until the number of times of update reaches a predetermined number of times so that the patterns of input signals for the selected partial circuit group may be properly limited and the partial circuit information on each of the corresponding partial circuits, which is stored in the partial-circuit-information storage section 131, may be updated. This processing may reduce the amount of calculation processing for generating the partial circuit group information on each of the partial circuit groups by the partial-circuit-group-information generating section 142.

When the number of times of update reaches the predetermined number of times, the maximum-leak-current-value calculating section 149 uses the information on the leak current value of each of the partial circuits, which is contained in the partial circuit information on each of the corresponding partial circuits stored in the partial-circuit-information storage section 131, to calculate the maximum leak current value of the integrated circuit. More specifically, when the maximum-leak-current-value calculating section 149 receives the notification that the number of times of update has reached the predetermined number of times from the processing control unit 148, the maximum-leak-current-value calculating section 149 first extracts the maximum values of the leak current values of the partial circuits from the partial circuit characteristic information on each of the partial circuits, which is stored in the partial-circuit-information storage section 131. The maximum-leak-current-value calculating section 149 then calculates the total of maximum values of the extracted leak current values as a maximum leak current value of the integrated circuit.

The maximum-leak-current-value calculating section 149 transmits the processing result including the information on the calculated maximum leak current value to the integrated circuit output unit 120.

Figure 11:
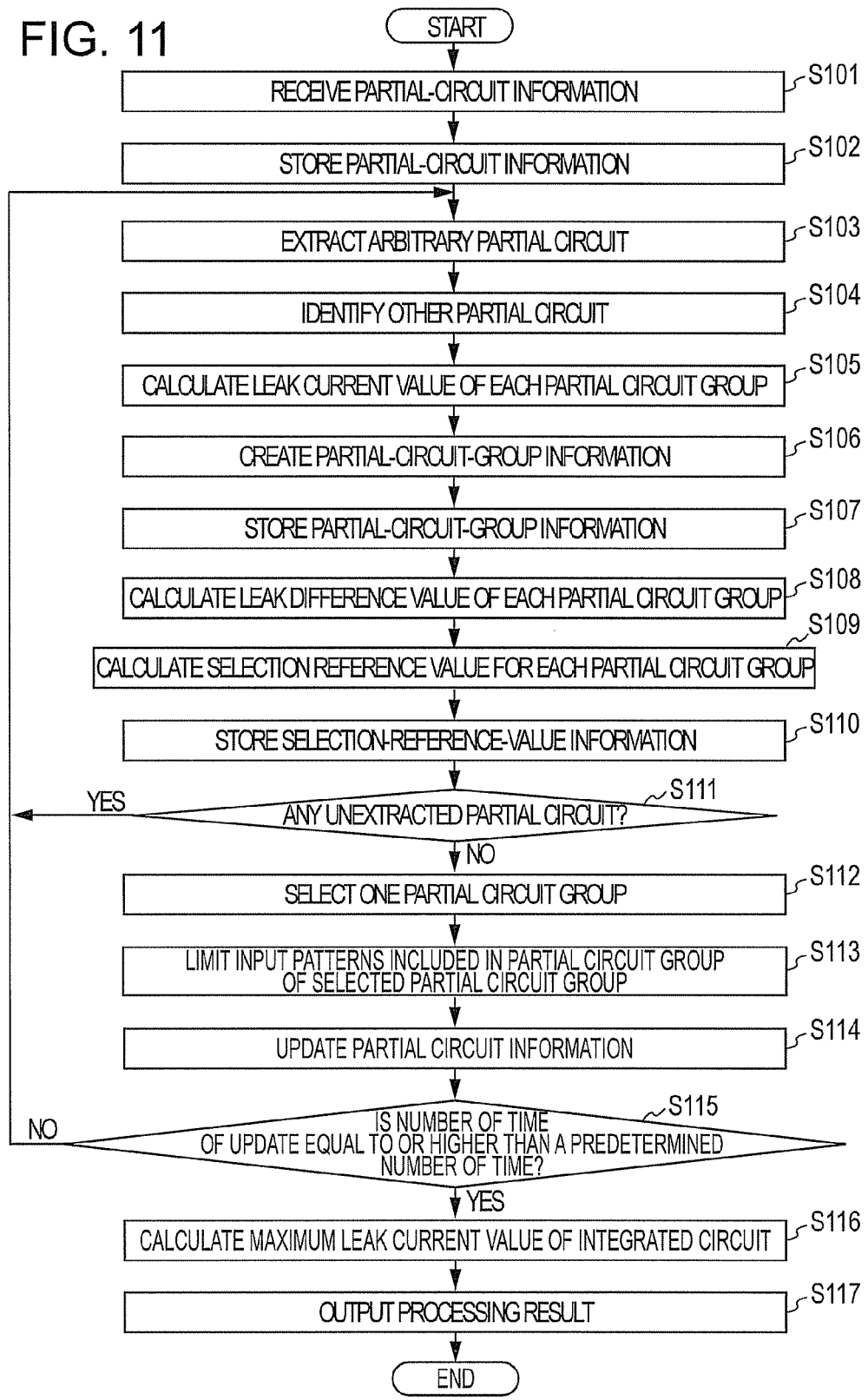
FIG. 11 is a flowchart illustrating a processing routine of leak current calculation processing by the leak current calculation apparatus.

Next, with reference to FIG. 11, there will be described the processing routine of the leak current calculation processing by the leak current calculation apparatus 100 according to this embodiment. FIG. 11 is a flowchart illustrating a processing routine of leak current calculation processing by the leak current calculation apparatus 100 according to this embodiment.

As illustrated in FIG. 11, in the leak current calculation apparatus 100, the partial-circuit-information acquiring section 141 receives partial circuit information (including the partial circuit characteristic information and partial circuit connection information) from the input unit 110 (step S101) and stores the received partial circuit information to the partial-circuit-information storage section 131 (step S102).

Next, the partial-circuit-group-information generating section 142 refers to the partial circuit connection information stored in the partial-circuit-information storage section 131 to extract one arbitrary partial circuit (step S103) and identifies other partial circuits connecting to the extracted partial circuit (step S104). In other words, the partial-circuit-group-information generating section 142 regards a set of the arbitrary partial circuit and other partial circuits as a partial circuit group. The partial-circuit-group-information generating section 142 refers to the partial circuit characteristic information stored in the partial-circuit-information storage section 131 to properly combine the input patterns of the partial circuits included in the partial circuit group. Thus, the leak current value caused in accordance with the input pattern is calculated for each partial circuit group (step S105). Then, the partial-circuit-group-information generating section 142 generates the partial circuit group information on each partial circuit group (step S106) and stores it in the partial-circuit-group-information storage section 132 (step S107).

Next, the leak-difference-value calculating section 143 calculates the leak difference value of each partial circuit group (step S108), and the selection-reference-value calculating section 144 calculates, for each partial circuit group, the selection reference value, which may be acquired by dividing the leak difference value by the number of partial circuits included in the partial circuit group (step S109). The selection-reference-value calculating section 144 then stores the selection reference value information associated with the calculated selection reference value for each partial circuit group to the selection-reference-value-information storage section 133 (step S110).

Next, the selection-reference-value calculating section 144 determines whether any unextracted partial circuit exists or not (step S111). If it is determined that some unextracted partial circuit exists (Yes in step S111), the selection-reference-value calculating section 144 returns the processing to step S103 and notifies that there is some unextracted partial circuit to the partial-circuit-group-information generating section 142. The partial-circuit-group-information generating section 142 having received the notification from the selection-reference-value calculating section 144 recalculates the leak current value of the partial circuit group including partial circuits, which are different from the extracted partial circuit, and newly generates partial circuit group information.

On the other hand, if it is determined that no unextracted partial circuits exist (No in step S111), the selection-reference-value calculating section 144 notifies the fact to the partial-circuit-group selecting section 145. The partial-circuit-group selecting section 145 selects one partial circuit group from the plural partial circuit groups on the basis of the leak difference value (step S112). In other words, the partial-circuit-group selecting section 145 selects, as the selected partial circuit group, one partial circuit group with the highest selection reference value stored in the selection-reference-value-information storage section 133 from the plural partial circuit group.

Next, the input-signal-pattern limiting section 146 limits the input pattern contained in the partial circuit group information on the selected partial circuit group to the input pattern corresponding to a highest leak current value (step S113). For example, the input-signal-pattern limiting section 146 limits it to the input patterns corresponding to the maximum leak current value and second leak current value.

Next, the partial-circuit-information updating section 147 adds the partial circuit group information on the selected partial circuit group with the limited input patterns to the partial circuit information on each of the corresponding partial circuits and deletes the partial circuit information on the partial circuits included in the selected partial circuit group from the partial circuit information on each of the corresponding partial circuits to update the partial circuit information stored in the partial-circuit-information storage section 131 (step S114). At that time, the partial-circuit-information updating section 147 notifies the number of times of update to the processing control unit 148.

Next, the processing control unit 148 determines whether the number of times of update notified from the partial-circuit-information updating section 147 has reached a predetermined number of times or not (step S115). If it is determined that the number of times of update has not reached predetermined number of times (No in step S115), the processing control unit 148 returns the processing to step S103 and repeats the processing in step S103 to step S115.

If it is determined that the number of times of update has reached the predetermined number of times (Yes in step S115), the processing control unit 148 notifies the fact to the maximum-leak-current-value calculating section 149. Then, the processing control unit 148 moves the processing to step S116.

The maximum-leak-current-value calculating section 149 then uses the information on the leak current value of each of the partial circuits, which is contained in the partial circuit information on each of the corresponding partial circuits stored in the partial-circuit-information storage section 131, to calculate the maximum leak current value of the integrated circuit (step S116). In other words, the maximum-leak-current-value calculating section 149 extracts the maximum values of the leak current values of the partial circuits from the partial circuit characteristic information on each of the partial circuits, which is stored in the partial-circuit-information storage section 131. The maximum-leak-current-value calculating section 149 calculates the total of the maximum values of the extracted leak current values as a maximum leak current value of the integrated circuit.

The leak current calculation apparatus 100 then outputs the processing result (step S117). For example, the maximum-leak-current-value calculating section 149 transmits, as the processing result, the calculated total of the maximum leak current values of the integrated circuit to the output unit 120, and the output unit 120 outputs the processing result.

As described above, according to this embodiment, the patterns of input signals to the partial circuits included in an integrated circuit are limited, and the partial circuit information on the partial circuits is repetitively updated. From the updated partial circuit information, the maximum leak current value of the integrated circuit is calculated. Thus, the maximum leak current value of the integrated circuit may be calculated fast and securely.

Having described an embodiment of the present art, the present technique art may be implemented in various different embodiments excluding the aforementioned embodiment, without departing from the scope of the technical spirit disclosed in the appended claims.

For example, the illustrated components of the apparatus are only functional and conceptual and may not always be configured physically as illustrated. In other words, the specific forms of the distribution and integration apparatus are not limited to the illustrated ones, and all or a part of them may be distributed and/or integrated functionally or physically in arbitrary units in accordance with the loads and usages. For example, referring to FIG. 2, the partial-circuit-information acquiring section 141 and the maximum-leak-current-value calculating section 149 may be integrated. The storage unit 130 may be provided separately.

Figure 12:
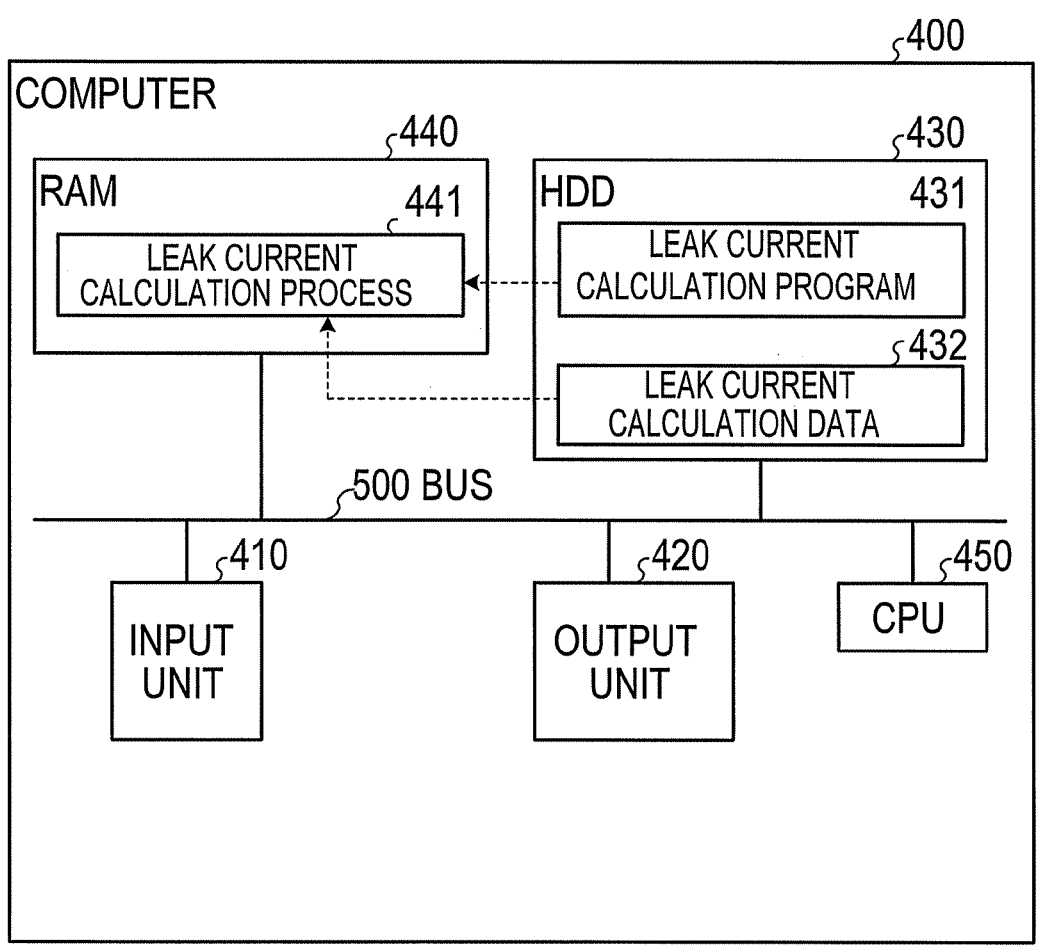
FIG. 12 is a diagram for explaining a computer that executes a leak current calculation program.

The processing by the leak current calculation apparatus according to the aforementioned embodiment may be implemented by causing a computer such as a personal computer and a workstation to execute a prepared program. With reference to FIG. 12, an example of the computer that executes a leak current calculation program having similar functions as those of the aforementioned embodiment will be described below. FIG. 12 is a diagram for explaining a computer that executes a leak current calculation program.

As illustrated in FIG. 12, a computer 400 functioning as a leak current calculation apparatus includes an input unit 410, an output unit 420, an HDD (hard disk Drive) 430, a RAM (random access memory) 440 and a CPU (central processing unit) 450, which are connected via a bus 500.

The input unit 410 receives the input of data from a user. The output unit 420 displays information. The HDD 430 stores information used for performing processing by the CPU 450. The RAM 440 temporarily stores information. The CPU 450 performs arithmetic processing.

The HDD 430 prestores a leak current calculation program 431 that exerts the similar functions to those of the processing sections in the leak current calculation apparatus 100 according to the first embodiment and leak current calculation data 432. Notably, the leak current calculation program 431 may be distributed as required and be stored in a storage unit of another computer, which is communicably connected thereto over a network.

The CPU 450 may read the leak current calculation program 431 from the HDD 430 and expand it to the RAM 440. Thus, as illustrated in FIG. 12, the leak current calculation program 431 may function as a leak current calculation process 441. In other words, the leak current calculation process 441 may read leak current calculation data 432, for example, from the HDD 430, expand it in an area, which is assigned to the leak current calculation process 441, in the RAM 440, and perform the processing on the basis of the expanded data. Notably, the leak current calculation process 441 corresponds to the processing to be performed in the control unit 140 (including partial-circuit-information acquiring section 141, partial-circuit-group-information generating section 142, leak-difference-value calculating section 143, selection-reference-value calculating section 144, partial-circuit-group selecting section 145, input-signal-pattern limiting section 146, partial-circuit-information updating section 147, processing control unit 148 and maximum-leak-current-value calculating section 149) in the leak current calculation apparatus 100 illustrated in FIG. 2.

The leak current calculation program 431 may not always be stored in the HDD 430 from the beginning. For example, the leak current calculation program 431 may be stored in a "portable physical medium" such as a flexible disk (FD), a CD-ROM, a DVD, a magneto-optical disk and an IC card to be inserted to the computer 400, and the computer 400 may read and execute a program from it. Alternatively, the program may be stored in "another computer (or server)" connected to the computer 400 through a public line, the Internet, a LAN or a WAN, for example, and the computer 400 may read and execute the program.

Thus, this embodiment has an effect that the maximum leak current of an integrated circuit may be calculated fast.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A leak current calculation apparatus to calculate a leak current value of an integrated circuit including a plurality of partial circuits, the leak current calculation apparatus comprising:
an acquiring section to acquire partial circuit information including leak current values caused by the partial circuits when input signal patterns are inputted to the partial circuits for each of the partial circuits;
a grouping section to form a plurality of circuit groups each including a part of the partial circuits connected with each other and to generate circuit group information including leak current values caused by the circuit groups when input signal patterns are inputted to the circuit groups for each of the circuit groups based on the acquired partial circuit information;
a leak difference value calculating section to calculate a leak difference value, which is a difference between a provisional maximum value acquired by adding up maximum values of the leak current values of all the partial circuits and a sum of maximum values of the leak current values contained in the circuit group information of the circuit groups; and
a maximum leak current calculating section to calculate a maximum leak current value of the integrated circuit by adjusting the provisional maximum value with the leak difference value.

2. The leak current calculation apparatus according to claim 1, wherein the leak difference value calculating section calculates a leak difference value which is a difference between a provisional maximum value acquired by adding up the maximum values of the leak current values of all the partial circuits included in each of the circuit group and a maximum value of the leak current values contained in the circuit group information of each of the circuit groups.

3. The leak current calculation apparatus according to claim 2, further comprising:
a selecting section to select one of the circuit groups based on the leak difference value calculated by the leak difference value calculating section;
a limiting section to limit an input signal pattern contained in circuit group information on the selected circuit group to an input signal pattern corresponding to a highest leak current value;
an updating section to add the circuit group information on the selected circuit group with the limited input signal pattern to the partial circuit information on each of the corresponding partial circuits and to delete the partial circuit information on the partial circuits included in the selected circuit group from the partial circuit information on each of the corresponding partial circuits to update the acquired partial circuit information; and
a processing section for repetitively performing a corresponding processing until a number of times of processing by the updating section reaches a predetermined number of times,
wherein the maximum leak current calculating section calculates the maximum leak current value of the integrated circuit, if the number of times of processing by the updating section reaches the predetermined number of times, by using information on the leak current value of each of the partial circuits, which is contained in the updated partial circuit information.

4. The leak current calculation apparatus according to claim 1, wherein the grouping section generates the partial circuit group information on the partial circuit group including partial circuits connected mutually in a tree shape of single input/multi output before the partial circuit group information on other partial circuit groups.

5. The leak current calculation apparatus according to claim 1, wherein the grouping section generates the partial circuit group information on the partial circuit group including partial circuits connected mutually in a tree shape of multi-input/single output before the partial circuit group information on other partial circuit group.

6. A method to calculate a leak current value of an integrated circuit including a plurality of partial circuits, the method comprising:

acquiring partial circuit information including leak current values caused by the partial circuits when input signal patterns are inputted to the partial circuits for each of the partial circuits;

forming a plurality of circuit groups each including a part of the partial circuits connected with each other and generating circuit group information including leak current values caused by the circuit groups when input signal patterns are inputted to the circuit groups for each of the circuit groups based on the partial circuit information acquiring;

calculating, using a processor, a leak difference value, which is a difference between a provisional maximum value acquired by adding up maximum values of the leak current values of all the partial circuits and a sum of maximum values of the leak current values contained in the circuit group information of the circuit groups; and calculating, using a processor, a maximum leak current value of the integrated circuit by adjusting the provisional maximum value with the leak difference value.

7. The method according to claim 6, wherein the leak difference value calculating operation includes calculating a leak difference value which is a difference between a provisional maximum value acquired by adding up the maximum values of the leak current values of all the partial circuits included in each of the circuit group and a maximum value of the leak current values contained in the circuit group information of each of the circuit groups.

8. The method according to claim 7, further comprising:

selecting one of the circuit groups based on the calculated leak difference value;

limiting an input signal pattern contained in the circuit group information on the selected circuit group to an input signal pattern corresponding to a highest leak current value;

adding the circuit group information on the selected circuit group with a limited input signal pattern to the partial circuit information on each of the corresponding partial circuits and deleting the partial circuit information on the partial circuits included in the selected circuit group from the partial circuit information on each of the corresponding partial circuits to update the acquired partial circuit information; and repetitively performing a corresponding processing until a number of times of processing by the updating section reaches a predetermined number of times, wherein the maximum leak current calculating operation calculates the maximum leak current value of the integrated circuit, if the number of times of processing by the updating section reaches the predetermined number of times, by using information on the leak current value of each of the partial circuits, which is contained in the updated partial circuit information.

9. The method according to claim 6, wherein the forming generates the partial circuit group information on the partial circuit group including partial circuits connected mutually in a tree shape of single input/multi output before the partial circuit group information on other partial circuit groups.

10. The method according to claim 6, wherein the forming generates the partial circuit group information on the partial circuit group including partial circuits connected mutually in a tree shape of multi-input/single output before the partial circuit group information on other partial circuit group.

11. A non-transitory storage medium storing a leak current value calculation program allowing causing a processor of a computer to execute a process for a leak current value calculation of an integrated circuit including a plurality of partial circuits, the process comprising:

acquiring partial circuit information including leak current values caused by the partial circuits when input signal patterns are inputted to the partial circuits for each of the partial circuits;

forming a plurality of circuit groups each including a part of the partial circuits connected with each other and generating circuit group information including leak current values caused by the circuit groups when input signal patterns are inputted to the circuit groups for each of the circuit groups based on the acquired partial circuit information the acquiring;

calculating a leak difference value, which is a difference between a provisional maximum value acquired by adding up maximum values of the leak current values of all the partial circuits and a sum of maximum values of the leak current values contained in the circuit group information of the circuit groups; and calculating a maximum leak current value of the integrated circuit by adjusting the provisional maximum value with the leak difference value.

12. The non-transitory storage medium according to claim 11, wherein the leak difference value calculating operation includes calculating a leak difference value which is a difference between a provisional maximum value acquired by adding up the maximum values of the leak current values of all the partial circuits included in each of the circuit group and a maximum value of the leak current values contained in the circuit group information of each of the circuit groups.

13. The non-transitory storage medium according to claim 12, the process comprising:

selecting one of the circuit groups based on the leak difference value calculated by the leak difference value calculating operation;

limiting an input signal pattern contained in the circuit group information on the selected circuit group to an input signal pattern corresponding to a highest leak current value;

adding the circuit group information on the selected circuit group with the limited input signal pattern to the partial circuit information on each of the corresponding partial circuits and deleting the partial circuit information on the partial circuits included in the selected circuit group from the partial circuit information on each of the corresponding partial circuits to update the acquired partial circuit information; and repetitively performing a corresponding processing until a number of times of processing by the updating section reaches a predetermined number of times, wherein the maximum leak current calculating operation calculates the maximum leak current value of the integrated circuit, if the number of times of processing by the updating section reaches the predetermined number of times, by using information on the leak current value of each of the partial circuits, which is contained in the updated partial circuit information.

14. The non-transitory storage medium according to claim 11, wherein forming generates the partial circuit group information on the partial circuit group including partial circuits connected mutually in a tree shape of single input/multi output before the partial circuit group information on other partial circuit groups.

15. The non-transitory storage medium according to claim 11, wherein the forming generates the partial circuit group information on the partial circuit group including partial circuits connected mutually in a tree shape of multi-input/single output before the partial circuit group information on other partial circuit group.

16. The non-transitory storage medium according to claim 11, wherein the calculating of the leak difference value is performed using a processor.

17. The non-transitory storage medium according to claim 11, wherein the calculating of the maximum leak current value is performed using a processor.

* * * * *

UNITED STATES PATENT AND TRADEMARK OFFICE
CERTIFICATE OF CORRECTION

| | |
|---|---|
| PATENT NO. | : 8,407,642 B2 |
| APPLICATION NO. | : 12/720033 |
| DATED | : March 26, 2013 |
| INVENTOR(S) | : Yuzi Kanazawa |

It is certified that error appears in the above-identified patent and that said Letters Patent is hereby corrected as shown below:

In the Claims:

Column 19, Line 14, In Claim 6, after "information" delete "acquiring".
Column 20, Line 2, In Claim 11, after "program" delete "allowing".
Column 20, Line 16, In Claim 11, after "information" delete "the acquiring".

Signed and Sealed this
Sixteenth Day of July, 2013

Teresa Stanek Rea
*Acting Director of the United States Patent and Trademark Office*